(12) United States Patent
Smilde et al.

(10) Patent No.: US 8,411,287 B2
(45) Date of Patent: Apr. 2, 2013

(54) METROLOGY METHOD AND APPARATUS, LITHOGRAPHIC APPARATUS, DEVICE MANUFACTURING METHOD AND SUBSTRATE

(75) Inventors: Hendrik Jan Hidde Smilde, Veldhoven (NL); Arno Jan Bleeker, Westerhoven (NL); Arie Jeffrey Den Boef, Waalre (NL); Armand Eugene Albert Koolen, Nuth (NL); Henricus Petrus Maria Pellemans, Veldhoven (NL); Reinder Teun Plug, Eindhoven (NL); Willem Marie Julia Marcel Coene, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 349 days.

(21) Appl. No.: 12/855,394

(22) Filed: Aug. 12, 2010

(65) Prior Publication Data

US 2011/0043791 A1 Feb. 24, 2011

Related U.S. Application Data

(60) Provisional application No. 61/236,266, filed on Aug. 24, 2009.

(51) Int. Cl.
*G01B 11/14* (2006.01)

(52) U.S. Cl. .......................... 356/620; 356/614; 356/615

(58) Field of Classification Search .......... 356/399–401, 356/620
See application file for complete search history.

(56) References Cited

U.S. PATENT DOCUMENTS

| | | | |
|---|---|---|---|
| 7,433,039 B1 | 10/2008 | Levinski et al. | |
| 2003/0026471 A1* | 2/2003 | Adel et al. | 382/144 |
| 2008/0049226 A1 | 2/2008 | Mieher et al. | |
| 2008/0239318 A1 | 10/2008 | Den Boef et al. | |

FOREIGN PATENT DOCUMENTS

| WO | WO 2009/078708 A1 | 6/2009 |
|---|---|---|
| WO | WO 2009/106279 A1 | 9/2009 |
| WO | WO 2010/031510 A1 | 3/2010 |

OTHER PUBLICATIONS

International Search Report directed to related International Application No. PCT/EP2010/061379, mailed on Nov. 18, 2010, European Patent Office, Rijswijk, Netherlands; 16 pages.

* cited by examiner

*Primary Examiner* — Michael P Stafira
(74) *Attorney, Agent, or Firm* — Sterne, Kessler, Goldstein & Fox P.L.L.C.

(57) ABSTRACT

A metrology apparatus is arranged to illuminate a plurality of targets with an off-axis illumination mode. Images of the targets are obtained using only one first order diffracted beam. Where the target is a composite grating, overlay measurements can be obtained from the intensities of the images of the different gratings. Overlay measurements can be corrected for errors caused by variations in the position of the gratings in an image field.

33 Claims, 3 Drawing Sheets

METROLOGY METHOD AND APPARATUS, LITHOGRAPHIC APPARATUS, DEVICE MANUFACTURING METHOD AND SUBSTRATE

CROSS REFERENCE TO RELATED APPLICATIONS

This application claims benefit under 35 U.S.C. §119(e) to U.S. Provisional Patent Application 61/236,266, filed Aug. 24, 2009, which is incorporated by reference herein in its entirety.

BACKGROUND

1. Field of the Invention

The present invention relates to methods and apparatus for metrology usable, for example, in the manufacture of devices by lithographic techniques and to methods of manufacturing devices using lithographic techniques.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 μm by 40 μm, gratings and the measurement beam generates a spot that is smaller than the grating (i.e., the grating is underfilled). This simplifies reconstruction of the target as it can be regarded as infinite. However, in order to reduce the size of the targets, e.g., to 10 μm by 10 μm or less, e.g., so they can be positioned in amongst product features, rather than in the scribe lane, so-called dark field metrology has been proposed. Placing the target in amongst the product features increases accuracy of measurement because the smaller target is affected by process variations in a more similar way to the product features and because less interpolation may be needed to determine the effect of a process variation at the actual feature site.

In dark field metrology, a small grating is illuminated with a large measurement spot (i.e., the grating is overfilled). Often the illumination is off-axis, in other words, the measurement beam is incident on the target within a narrow angular range not including the normal to the substrate. In the measurement branch of the scatterometer, the zeroth order diffracted by the target is blocked by a field stop and the grating is imaged on a detector using only one of the first order diffracted beams. A second image of the grating is obtained using only the other first order diffracted beam. If the grating is formed by superimposition of identical gratings, a measure of the overlay error between those two superimposed gratings can be obtained from the difference in intensity of the images formed from the respective first order diffracted beams. Dark field metrology has some disadvantages. For example, throughput is reduced as two images of each grating are required and multiple pairs of differently biased gratings are required for accurate determination for overlay. The use of multiple pairs of gratings also increases the space on the substrate that needs to be devoted to metrology targets and hence is unavailable for product features. Because the gratings are overfilled, aberrations in the imaging system can cause variations in the position of the grating to influence the measurement results.

SUMMARY

It is desirable to provide an improved metrology method and apparatus, e.g., that can make more accurate and/or measurements on smaller targets.

According to an embodiment of the present invention, there is provided a metrology apparatus configured to measure properties of a plurality of targets on a substrate. The apparatus comprises a source, an objective lens, a sensor, and an image processor. The source is configured to emit an illumination beam of radiation. The objective lens is configured to direct the measurement beam of radiation onto the targets on the substrate and to collect radiation diffracted by the targets. The sensor is configured to detect an image of the targets. The source, objective lens, and sensor are arranged so that the illumination beam substantially simultaneously illuminates the targets and the image of the targets that is detected by the sensor is formed by one first order diffracted beam. The image processor is configured to identify separate images of respective ones of the targets in the image detected by the sensor.

According to another embodiment of the present invention, there is provided a method of measuring a properties of a plurality of targets on a substrate comprising the following steps. Generating an illumination beam. Directing the illumination beam as a measurement beam onto the targets using an objective lens so that the measurement beam simultaneously illuminates the targets. Collecting radiation diffracted by the target using the objective lens. Detecting an image of the targets the image being formed by only one first order diffracted beam. Identifying separate images of respective ones of the targets in the detected image.

According to a further embodiment of the present invention, there is provided a substrate having thereon at least four metrology targets, wherein the metrology targets comprise gratings and are located adjacent one another in an array that can be circumscribed closely by a circle.

Corrections may be applied in the overlay measurements in accordance with the positions of the target images in a sensor image, to compensate for optical aberrations.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
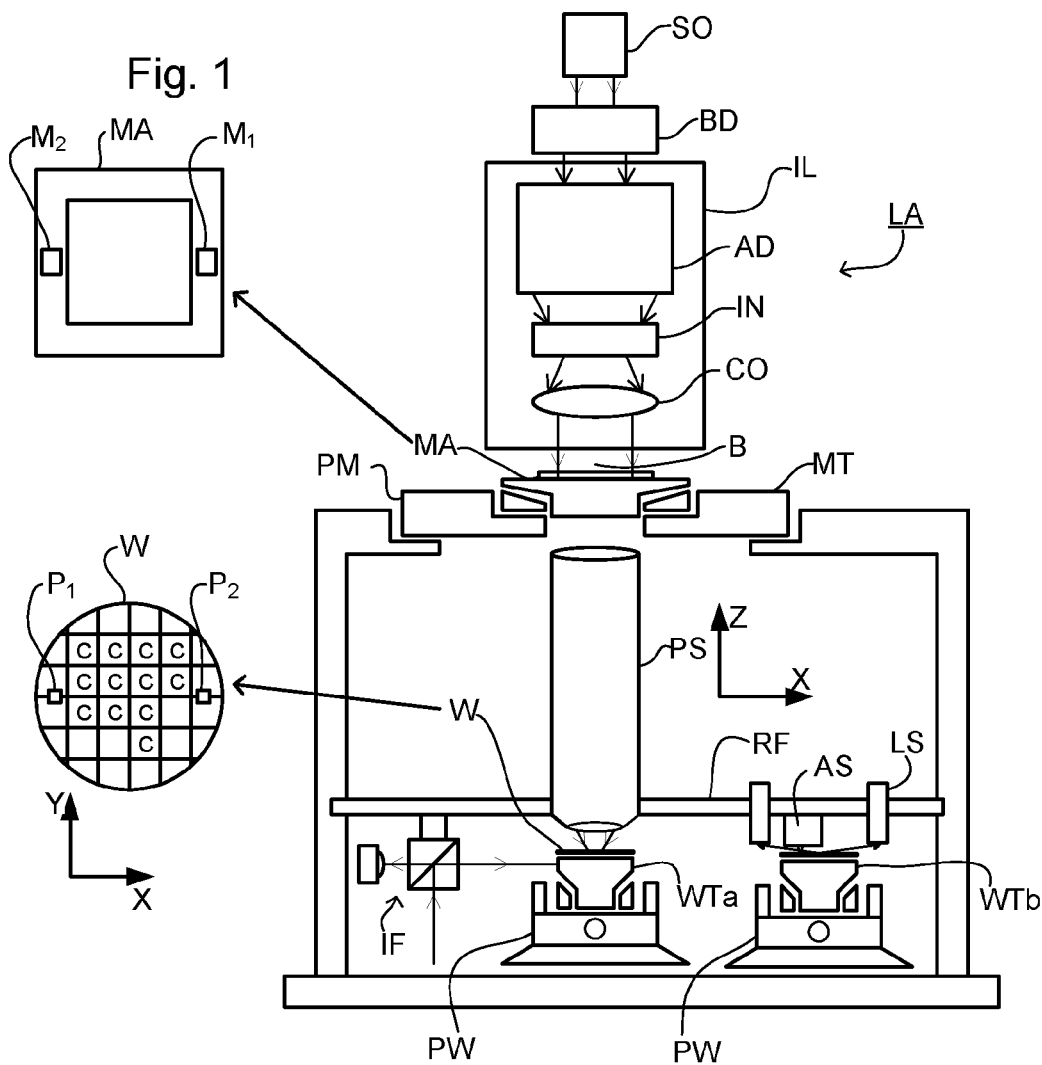
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations— an exposure station and a measurement station—between which the substrate tables can be exchanged. While one substrate or one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
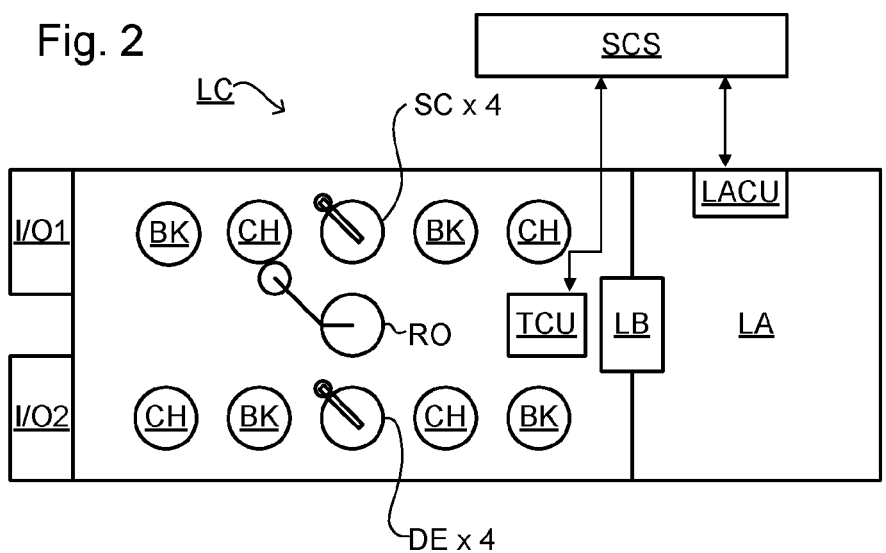
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Examples of dark field metrology can be found in WO 2009/078708 and International application WO 2009/106279 (PCT/EP09/001,271, filed 23 Feb. 2009, not published at the present priority date) which documents are hereby incorporated by reference in their entirety.

Figure 3:
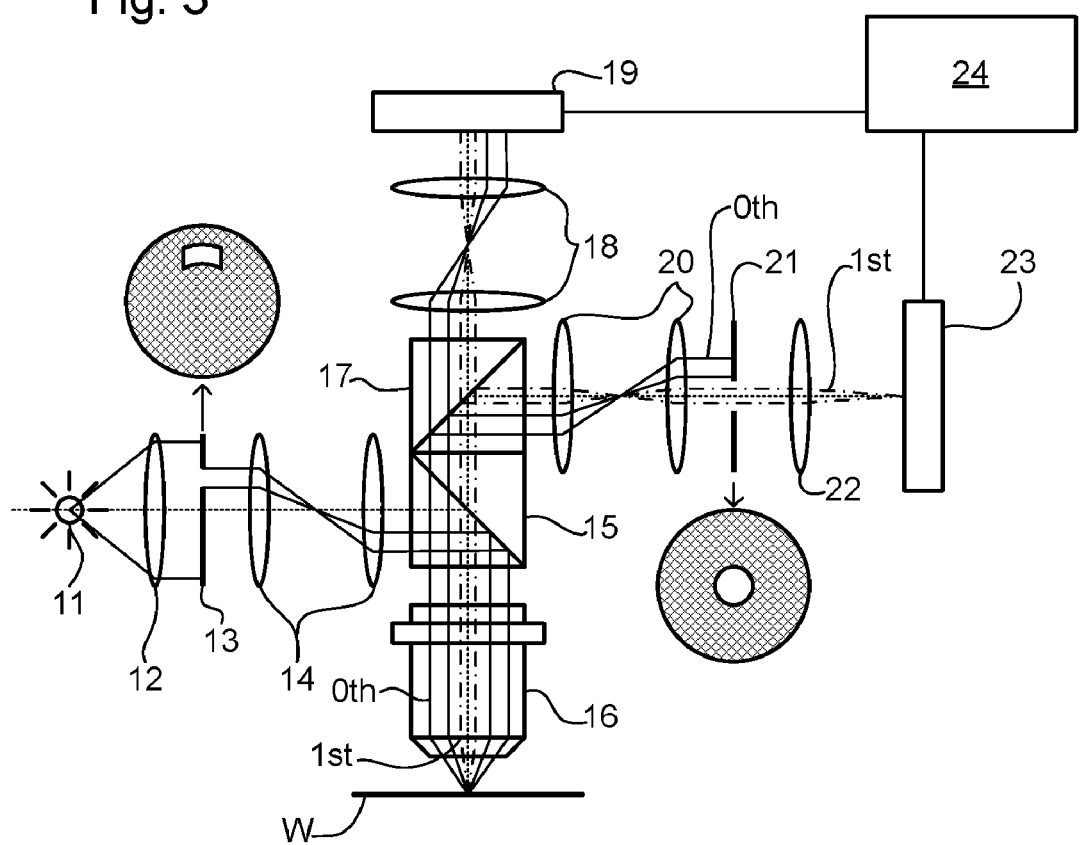
FIG. 3 depicts a dark field scatterometer according to an embodiment of the invention.

A dark field metrology apparatus according to an embodiment of the invention is shown in FIG. 3. The dark field metrology apparatus may be a stand alone device or incorporated in either the lithographic apparatus LA, e.g., at the measurement station, or the lithographic cell LC. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. Therefore, the angular range at which the radiation is incident on the substrate can be selected by defining a spatial intensity distribution in a plane that is conjugate with the substrate, i.e., a pupil plane. In particular, this can be done by inserting an aperture plate 13 of suitable form in the conjugate plane between lenses 12 and 14. In the present embodiment, aperture plate 13 has a single small aperture located off the optical axis of the illumination system formed by lenses 12, 14 and 16 so that the measurement beam is incident on substrate W in a narrow cone of angles not encompassing the normal to the substrate. The illumination system thereby forms an off-axis illumination mode with a single pole. The rest of the pupil plane is desirably dark as any unnecessary light outside the single pole will reduce contrast in the detected images. In an embodiment, the angle of incidence of the chief ray of the measurement beam on the grating is selected in accordance with the pitch of the grating so that one of the first order diffracted beams from the grating is directed into the objective lens 16 along its optical axis. Objective lens 16 has a high numerical aperture (NA), e.g., 0.95 or greater.

In one example, the zeroth order beam (solid line) and one first order beam (dot-chain line) diffracted by the target on substrate W are collected by objective lens 16 and directed back through beam splitter 15. A second beam splitter 17 divides the diffracted beams into two measurement branches. In a first measurement branch optical system 18 forms a diffraction spectrum (pupil plane image) of the target on first sensor 19 (e.g., a CCD or CMOS sensor) using the zeroth and first order diffractive beams. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the plane of the substrate W and the sensor 23. Aperture stop 21 functions to block the zeroth order diffracted beam so that the image of the target formed on sensor 23 is formed only from the first order beam. The images captured by sensors 19 and 23 are output to image processor and controller 24, the function of which will be described further below. In another embodiment of the invention, on-axis illumination of the targets is used and an aperture stop with an off-axis aperture is used to pass substantially only one first order of diffracted light to the sensor. In yet other embodiments, 2nd, 3rd and higher order beams can be used in measurements, instead of or in addition to the first order beams.

Figure 4:
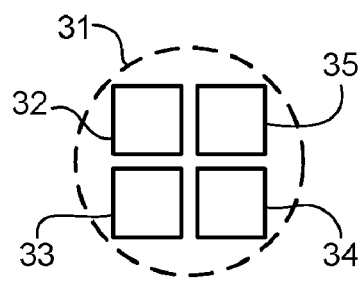
FIG. 4 depicts targets and an outline of a measurement spot on a substrate according to an embodiment of the invention.

FIG. 4 depicts a composite target formed on a substrate according to an embodiment of the invention. The composite target comprises four gratings 32 to 35 positioned closely together so that they will all be within the measurement spot 31 formed by the illumination beam of the metrology apparatus and thus are all simultaneously illuminated and simultaneously imaged on sensors 19 and 23. Gratings 32 to 35 are themselves composite gratings formed by overlying gratings that are patterned in different layers of the semi-conductor device formed on substrate W. Gratings 32 to 35 are differently biased in order to facilitate measurement of overlay between the layers in which the different parts of the composite gratings are formed. In an embodiment of the invention, gratings 32 to 35 may have biases of +D, −D, +3D, −3D. This means that one of the gratings has its components arranged so that if they were both printed exactly at their nominal locations one of the components would be offset relative to the other by a distance D. A second grating has its components arranged so that if perfectly printed there would be an offset of D but in the opposite direction to the first grating and so on.

Figure 5:
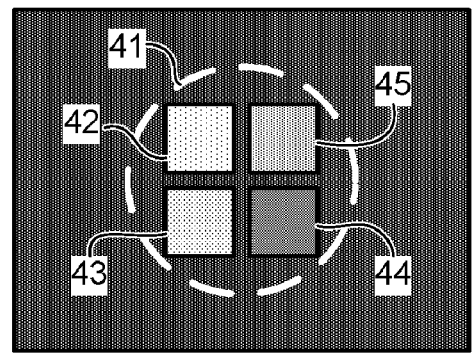
FIG. 5 depicts an image of the targets of FIG. 4 obtained in a method according to an embodiment of the invention.

In a method according to an embodiment of the invention, shown in FIG. 5, the overlay error between the two layers containing the components of gratings 32 to 35 is measured. Using the metrology apparatus of FIG. 3, an image of the gratings 32 to 35 is obtained from one of the first order diffracted beams. If the gratings are located in product areas, product features may also be visible in this image. Then, either the substrate W or the aperture plate 13 is rotated by 180° so that a second image of the gratings using the other first order diffracted beam can be obtained. Image processor and controller 24 processes these images to identify the separate images of gratings 32 to 35. This can be done by pattern matching techniques. Once the separate images of the gratings have been identified, the intensities of those individual images can be measured, e.g., by averaging or summing selected pixel intensity values. The overlay can then be determined by the image processor and controller 24 from the thus obtained intensity values, e.g., according to the following equation:

$$[I_{+1^{st}\ diffraction\ order} - I_{-1^{st}\ diffraction\ order}](\text{overlay}) = \sum_{n}^{N} K_n \cdot \sin\left(\frac{2\pi \cdot n}{\text{pitch}} \text{overlay}\right) \quad (1)$$

This embodiment therefore allows a more accurate determination of the overlay than if a single pair of oppositely biased gratings is used, without decreasing throughput. In Equation (1), N equals one less than the number of differently biased gratings so that, for example, with four differently biased gratings the relationship between overlay and intensity can be modeled as a function with three harmonics. As each grating has a different, known overlay bias, the overlay value in the above equation for each grating is the sum of the actual, unknown overlay, which is common to all gratings, and the respective, known overlay bias. Thus, the two measurements on each of N different gratings give N equations which can be solved to give the unknown actual overlay value and (N−1) K values.

Figure 6:
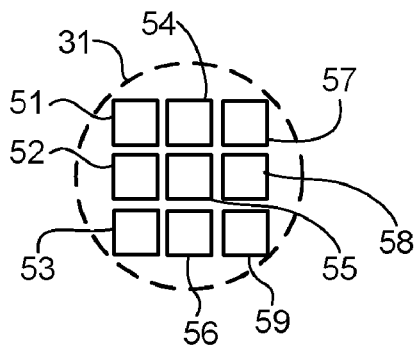
FIG. 6 depicts targets and an outline of a measurement spot on a second substrate according to an embodiment of the invention.
Figure 7:
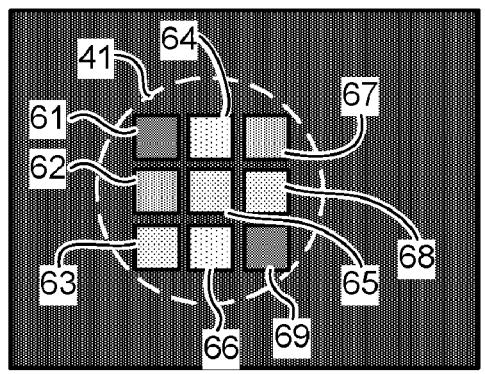
FIG. 7 depicts an image of the targets of FIG. 6 obtained in a method according to an embodiment of the invention.

As shown in FIGS. 6 and 7, this embodiment of the invention can be extended to include larger numbers of gratings to be simultaneously imaged. FIG. 6 shows nine composite gratings 51 to 59 which may have biases −4D, −3D, −2D, −D, 0, +D, +2D, +3D, +4D. As shown in FIG. 7, separate images 61 to 69 of these gratings can be identified in the image captured by sensor 23.

In the event that the intensity profile of the spot is non-uniform over the area of the gratings, a correction can be applied by the image processor and controller 24 prior to calculation of intensity values. The correction may be defined by measuring the spot intensity profile in a calibration procedure using an unpatterned part of the wafer. If the gratings are particularly close together on the substrate, it is possible that the optical filtering in the second measurement branch may cause cross talk between signals. In that event, the central opening in spatial filter 21 should be made as large as possible whilst still blocking the zeroth order.

Figure 8:
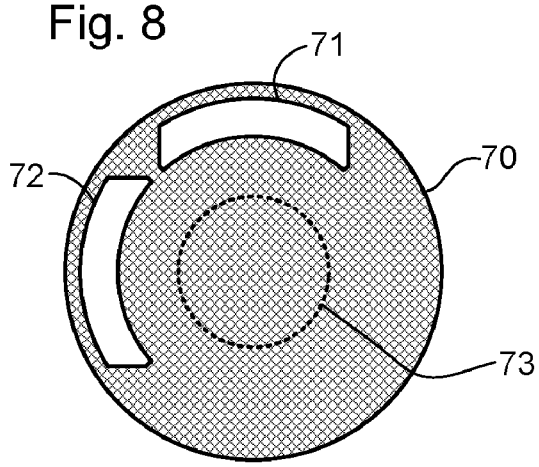
FIG. 8 depicts an illumination mode used in a method according to an embodiment of the invention.
Figure 9:
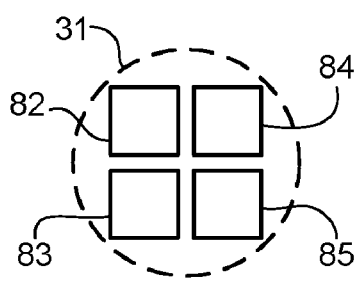
FIG. 9 depicts targets and an outline of a measurement spot on a third substrate according to an embodiment of the invention to be used with the illumination mode of FIG. 8.
Figure 10:
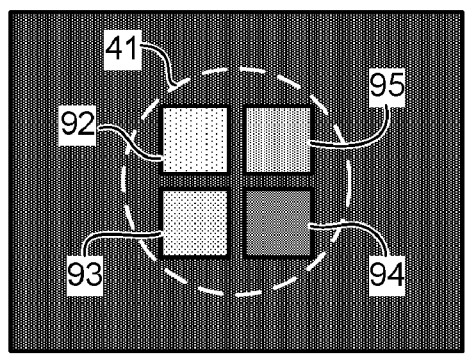
FIG. 10 depicts an image of the targets of FIG. 9 obtained in a method according to an embodiment of the invention.

In a further embodiment of the invention, simultaneous measurement of both X and Y overlay error is allowed. In the second embodiment, the intensity distribution in the pupil plane of the illumination branch is arranged to be as shown in FIG. 8, e.g., by provision of an aperture plate 70 with apertures 71 and 72. This arrangement ensures that the measurement spot on the substrate is illuminated by two cones of light, one having its chief ray in the YZ plane and the other its chief ray in the XZ plane. In other words, the illumination system forms an off-axis illumination mode with two poles. The measurement beam is arranged to illuminate a set of gratings 82 to 85 as shown in FIG. 9. Gratings 82 to 85 comprise two gratings oriented for measurement of overlay in the X direction, i.e., having their lines parallel to the Y axis and having biases of +D and −D respectively and two gratings oriented for measurement of overlay in the Y direction, i.e., having their lines parallel to the X axis and again having respective biases of +D and −D. Separate images 92 to 95 of these gratings are shown in FIG. 10. As in the first embodiment, these images can be separately identified and their intensities determined by the image processor and controller 24. In an example, the operation of the second embodiment is the same as the first embodiment and the same considerations and advantages apply.

It will be appreciated that the target arrays provided in this embodiment of the invention can be located in the scribe lane or within product areas. By including multiple targets within an area illuminated by the measurement spot 31, several advantages may accrue. For example, throughput is increased by acquisition of multiple target images in one exposure, less area on the substrate need be dedicated to metrology targets and accuracy of overlay measurements can be improved, especially where there is a non-linear relationship between the intensities of the different first order diffraction beams and overlay.

Target Position Correction

When the optical system suffers from aberrations, defocus, illumination inhomogeneities or a combination thereof, the measured asymmetries (in the small target overlay measurement) or intensities (in dark field) depend not only on the overlay but also on the actual position of the target in the light beam. Since we cannot predict this position, it could lead to significant noise and unacceptable inaccuracy in the measured overlay. Time spent on accurate positioning will reduce throughput of the apparatus. To provide optical elements with less aberration will simply make the apparatus more expensive. Accordingly, there will now be described techniques for correction of position-dependent errors.

In dark field the position of the target in the light beam is in principle known, because the DF image is recorded in the image plane (alignment camera in YS). This information can be used to correct the measured intensity either through empirical calibration or from theoretical knowledge of the aberrations.

In the case of calibration, a series of measurements at shifted positions is done to set up a calibration table to correct future measurements. In the case of a theoretical approach, if one knows the aberrations in the measurement optical system, then the position dependency of the measurement can be calculated. Here, illumination inhomogeneities can be measured in a calibration step, and subsequently used as input for the theoretical correction procedure of the overlay measurement. The corrected overlay can then be extracted in different modes:

Reconstruction of the overlay can be done using in a scalar model with inputs: (i) position information, (ii) defocus and (iii) aberrations.

In a library approach one can use scalar or vectorial simulation with 2D position variables, and defocus and aberration-set as parameters. Stack-dependent $1^{st}$ order diffraction efficiencies relative to the specular reflection may be used as (linear) scaling factors. For this purpose, the specular (zero order) reflection signal can be measured in sensor 19, while the dark field image is captured by sensor 23.

Defocus, which is a position error in the Z direction, acts as an additional aberration. Accordingly, if focus variations are known, the same principles can be applied to correct intensities or other properties of the measured signal which are caused by focus variation between measurements. This will save time in measurement, if focus (Z positioning) also does not need to be done with extreme accuracy. This can be solved in the following ways:

Measure focus as part of the calibration procedure and either use this knowledge in the correction procedure or correct focus beforehand. This requires focus to be reproducible during the measurements.

Measure (and or correct) focus at each measurement site e.g. by analyzing the image of the grating.

The correction of measurements to take account of positional variation can be applied to other types of measurement, not only the dark field overlay measurement described above. As mentioned above, other types of measurement can be done with the apparatus described. In co-pending international patent application PCT/EP2009/006518, for example, the pupil image sensor 19 is used to measure intensities of the +1 and −1 diffraction signals from a target, and these intensity signals are combined to obtain an overlay measurement. During such a measurement, sensor 23 can be used to take a second image simultaneously with the image recorded in the pupil plane sensor 19. This second image gives position information which can be used to do the corrections of the signals measured in the pupil plane, similar to the procedures described above. PCT/EP2009/006518 was filed on Sep. 9, 2009 and claims priority from U.S. 61/097,374 filed on Sep. 16, 2008

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus comprising:
   an objective lens configured to direct a beam of radiation onto targets on a substrate and to collect radiation diffracted by the targets;
   a sensor configured to detect an image of the targets; and
   an image processor configured to identify separate images of respective ones of the targets in the image detected by the sensor,
   wherein the source, the objective lens, and the sensor are arranged so that the beam substantially simultaneously illuminates the targets and so that the image of the targets that is detected by the sensor is formed by one first order diffracted beam.

2. The apparatus of claim 1, wherein the image processor comprises a pattern recognizer.

3. The apparatus of claim 2, wherein the pattern recognizer is configured to recognize an array of four or more separate images.

4. The apparatus of claim 1, further comprising a controller configured to determine an intensity value from each of the separate images.

5. The apparatus of claim 4, wherein the controller is further configured to determine an overlay error between layers of the substrate in which parts of the target are formed from the determined intensity values.

6. The apparatus of claim 5, wherein the controller is configured to determine overlay on based on:

$$[I_{+1^{st} \text{ diffraction order}} - I_{-1^{st} \text{ diffraction order}}](\text{overlay}) = \sum_n^N K_n \cdot \sin\left(\frac{2\pi \cdot n}{\text{pitch}} \text{overlay}\right).$$

7. The apparatus according to claim 4, wherein the controller is further configured to determine the position of said target images within an image field of the sensor, and to apply a correction in the determined intensity or overlay value by reference to the determined position.

8. The apparatus of claim 1, wherein the source and the objective lens are arranged to illuminate the targets in an off-axis illumination mode.

9. The apparatus of claim 8, wherein the off-axis illumination mode consists essentially of a single pole.

10. The apparatus of claim 8, wherein the off-axis illumination mode consists essentially of a first pole and a second pole.

11. The apparatus of claim 10, wherein the first pole is located on a first axis of the pupil plane and the second pole is located on a second axis of the pupil plane, the first and second axes being orthogonal.

12. The apparatus of claim 10, wherein the targets comprise at least one grating having lines perpendicular to the first axis and at least one grating having lines perpendicular to the second axis.

13. The apparatus of claim 1, wherein the targets include a first grating having a first bias and a second grating having a second bias, the second bias being different from the first bias.

14. The apparatus of claim 1, further comprising an aperture stop between the objective lens and the sensor, the aperture stop being configured to block the zeroth order of radiation diffracted by the targets.

15. The apparatus of claim 14, wherein the aperture stop is configured to pass substantially only one first order of radiation diffracted by the targets.

16. A lithographic apparatus comprising:
an illumination optical system arranged to illuminate a pattern;
a projection optical system arranged to project an image of the pattern onto a substrate; and
a metrology device comprising,
an objective lens configured to direct a beam of radiation onto targets on the substrate and to collect radiation diffracted by the targets;
a sensor configured to detect an image of the targets; and
an image processor configured to identify separate images of respective ones of the targets in the image detected by the sensor,
wherein the source, the objective lens, and the sensor are arranged so that the beam substantially simultaneously illuminates the targets and so that the image of the targets that is detected by the sensor is formed by one first order diffracted beam.

17. The apparatus of claim 16, further comprising:
an exposure station;
a measurement station; and
a substrate table moveable between the exposure station and the measurement station,
wherein the metrology device is positioned at the measurement station.

18. A lithographic cell comprising:
a lithographic apparatus;
at least one process device;
a substrate handler; and
a metrology device comprising,
an objective lens configured to direct a beam of radiation onto targets on a substrate and to collect radiation diffracted by the targets;
a sensor configured to detect an image of the targets; and
an image processor configured to identify separate images of respective ones of the targets in the image detected by the sensor,
wherein the source, the objective lens, and the sensor are arranged so that the beam substantially simultaneously illuminates the targets and so that the image of the targets that is detected by the sensor is formed by one first order diffracted beam.

19. A method comprising:
directing an illumination beam as a measurement beam onto targets using an objective lens so that the measurement beam substantially simultaneously illuminates the targets;
collecting radiation diffracted by the targets using the objective lens;
detecting an image of the targets, the image being formed by only one first order diffracted beam; and
identifying separate images of respective ones of the targets in the detected image.

20. The method of claim 19, wherein the identifying is performed by a pattern recognizer.

21. The method of claim 20, wherein the pattern recognizer is configured to recognize an array of four or more separate images.

22. The method of claim 19, further comprising determining an intensity value from each of the separate images.

23. The method of claim 22, further comprising determining an overlay error between layers of the substrate in which parts of the target are formed from the determined intensity values.

24. The method of claim 23, wherein the determining an overlay error is based on:

$$[I_{+1^{st} \text{ diffraction order}} - I_{-1^{st} \text{ diffraction order}}](\text{overlay}) = \sum_n^N K_n \cdot \sin\left(\frac{2\pi \cdot n}{\text{pitch}} \text{overlay}\right).$$

25. The method according to claim 22, wherein a correction is applied in the determined intensity or overlay value in accordance with the position of each target image within the detected image.

26. The method of claim 19, wherein the illumination beam is directed onto the targets in an off-axis illumination mode.

27. The method of claim 26, wherein the off-axis illumination mode consists essentially of a single pole.

28. The method of claim 26, wherein the off-axis illumination mode consists essentially of a first pole and a second pole.

29. The method of claim 28, wherein the first pole is located on a first axis of the pupil plane and the second pole is located on a second axis of the pupil plane, the first and second axes being orthogonal.

30. The method of claim 29, wherein the targets comprise at least one grating having lines perpendicular to the first axis and at least one grating having lines perpendicular to the second axis.

31. The method of claim 19, wherein the targets include a first grating having a first bias and a second grating having a second bias, the second bias being different from the first bias.

32. The method of claim 19, further comprising blocking the zeroth order of radiation diffracted by the targets between the objective lens and a sensor used to detect the image.

33. The method of claim 19, further comprising allowing substantially only one first order of radiation diffracted by the targets to reach a sensor used to detect the image.

* * * * *